(12) United States Patent
Jeong et al.

(10) Patent No.: US 7,936,038 B2
(45) Date of Patent: May 3, 2011

(54) PHOTODIODE CELL STRUCTURE OF PHOTODIODE INTEGRATED CIRCUIT FOR OPTICAL PICKUP AND METHOD OF MANUFACTURING THE SAME

(75) Inventors: Ha Woong Jeong, Gyunggi-do (KR);
Kyoung Soo Kwon, Gyunggi-do (KR);
Chae Dong Go, Gyunggi-do (KR);
Deuk Hee Park, Gyunggi-do (KR)

(73) Assignee: Samsung Electro-Mechanics Co., Gyunggi-Do (KR)

( * ) Notice: Subject to any disclaimer, the term of this patent is extended or adjusted under 35 U.S.C. 154(b) by 0 days.

(21) Appl. No.: 12/464,837

(22) Filed: May 12, 2009

(65) Prior Publication Data
US 2010/0244177 A1    Sep. 30, 2010

(30) Foreign Application Priority Data

Mar. 27, 2009  (KR) .................. 10-2009-0026412

(51) Int. Cl.
*H01L 31/105*    (2006.01)

(52) U.S. Cl. ............... 257/458; 257/463; 257/E31.057; 257/E33.046; 438/87

(58) Field of Classification Search .................. 257/458, 257/656, E33.046, E29.336, E31.036, E31.087–E31.088, 257/E31.061–E31.062, E31.058, E31.063, 257/E31.115, E25.032, E27.133–E27.139
See application file for complete search history.

(56) References Cited

U.S. PATENT DOCUMENTS 5,767,538 A * 6/1998 Mullins et al. ............... 257/115

* cited by examiner

*Primary Examiner* — N Drew Richards
*Assistant Examiner* — Mamadou Diallo
(74) *Attorney, Agent, or Firm* — Blakely Sokoloff Taylor & Zafman LLP

(57) ABSTRACT

Disclosed herein is a photodiode cell, including: a first-type substrate; a second-type epitaxial layer disposed on the first-type substrate; heavily-doped second-type layers, each having a small depth, formed on the second-type epitaxial layer; and heavily-doped first-type layers, each having a narrow and shallow section, disposed on the second-type epitaxial layer and formed between the heavily-doped second-type layers, wherein the first-type and second-type have opposite doped states.

8 Claims, 5 Drawing Sheets

PHOTODIODE CELL STRUCTURE OF PHOTODIODE INTEGRATED CIRCUIT FOR OPTICAL PICKUP AND METHOD OF MANUFACTURING THE SAME

CROSS REFERENCE TO RELATED APPLICATION

This application claims the benefit of Korean Patent Application No. 10-2009-0026412, filed Mar. 27, 2009, entitled "Photo Diode Cell structure of Photo Diode Integrated Circuit for Optical Pickup and method thereof", which is hereby incorporated by reference in its entirety into this application.

BACKGROUND OF THE INVENTION

1. Field of the Invention

The present invention relates to a photodiode cell structure of a photodiode integrated circuit for optical pickup and a method of manufacturing the same, and, more particularly, to a photodiode cell structure of a photodiode integrated circuit (hereinafter, referred to as 'PDIC') for optical pickup, in which highly-concentrated impurities are thinly doped between adjacent light-receiving regions and then floated, and thus the adjacent light-receiving regions are isolated from each other, thereby improving the optical efficiency of a photodetector, and a method of manufacturing the same.

2. Description of the Related Art

Generally, a photodetector is a transducer which detects light and then converts its strength into electrical signals. Examples of the photodetector include a photoelectric cell (silicon, selenium), a photoconductive device (cadmium sulfide, cadmium selenide), a photodiode, a phototransistor, a photomultiplier tube, a photoelectric tube (vacuum, gas sealing), and the like. Generally, the photodetector is fabricated using a direct transition semiconductor having excellent light conversion efficiency.

The photodetector has various structures, and generally includes a PIN photodetector using P-N junction, a Schottky photodetector using Schottky junction, a MSM (metal semiconductor metal) photodetector, and the like.

Meanwhile, recently, the importance of lasers and PDICs has been greatly highlighted in the optical data storage field. In order to replay and store optical data in a large-capacity storage medium, the wavelength of a laser must be shortened, and in order to detect the shortened wavelength thereof, the efficiency of a photodetector is required to be increased.

Currently, a photodetector which can detect wavelengths of 650 nm and 780 nm has a PIN structure. In order to increase the efficiency of such a photodetector, it is required to change the cell of a conventional photodetector used in a PDIC to a high-efficiency cell.

FIG. 1 is a plan view showing a conventional PIN-structured photodiode (PD) cell, and FIGS. 2A and 2B are sectional views of the photodiode (PD) cell taken vertically to a substrate along the line A-A' of FIG. 1, respectively.

In a conventional photodiode cell 100 of a photodiode integrated circuit for optical pickup, as shown in FIGS. 1, 2A and 2B, second-type epitaxial layers 103a and 103b (for example, N-type epitaxial layers), which become intrinsic layers having a P-I-N structure, are formed on a first-type substrate 101a or 101b (for example, a P-type substrate) through an epitaxial growth method. Subsequently, the second-type expitaxial layers 103a and 103b are formed thereon with heavily-doped second type layers 105a-1~4 and 105b-1~4 (for example, N⁺ layers) which are multi-divided light-receiving regions.

The heavily-doped second-type layers 105a-1~4 and 105b-1~4 formed in this way must be isolated from each other in order to increase their optical efficiency. For this, a method of completely isolating the heavily-doped second-type layers 105a-1~4 from each other by physically forming a first-type well 107a (for example, P-well) and a first-type BUR 109b (For example, PBUR) between adjacent heavily-doped second-type layers 105a-1~4, for example, two adjacent heavily-doped second-type layers 105a-1 and 105a-2 such that they are connected to a substrate 101a has been used (refer to FIG. 2A). However, this method is problematic in that the width of the first-type well 107a is excessively large, so that effective light-receiving regions become small, thereby decreasing optical efficiency.

Alternatively, a method of electrically isolating the heavily-doped second-type layers 105b-1~4 from each other by forming a first-type well 107b between adjacent heavily-doped second-type layers 105b-1~4, for example, two adjacent heavily-doped second-type layers 105b-1 and 105b-2 and then grounding the first-type well 107b (refer to FIG. 2B) has been used. However, this method is also problematic in that the first-type well 107b is grounded and thus connected to the ground (GND), so that leakage current is generated, thereby causing noise.

SUMMARY OF THE INVENTION

Accordingly, the present invention has been made keeping in mind the above problems occurring in the prior art, and the present invention provides a photodiode cell structure of a photodiode integrated circuit for optical pickup and a method of manufacturing the same, in which divided adjacent photodiode cells can be completely isolated from each other without using a physical isolation method using a well or an electrical isolation method using the application of voltage and grounding.

An aspect of the present invention provides a photodiode cell, including: a first-type substrate; a second-type epitaxial layer disposed on the first-type substrate; heavily-doped second-type layers, each having a small depth, formed on the second-type epitaxial layer; and heavily-doped first-type layers, each having a narrow and shallow section, disposed on the second-type epitaxial layer and formed between the heavily-doped second-type layers, wherein the first-type and second-type have opposite doped states.

In the photodiode cell, the first type may be a P-type, and the second-type may be an N-type.

Further, the first-type substrate may have an impurity concentration of $10^{16}$ cm$^{-3}$ or more, and the second-type epitaxial layer may have an impurity concentration of $10^{14}$ cm$^{-3}$ or less.

Further, each of the heavily-doped first-type layers may have a width of 1 μm or less, and the depths of the heavily-doped first-type layers may be equal to or greater than those of the heavily-doped second-type layers.

Further, the heavily-doped first-type layers may be floated.

Another aspect of the present invention provides a method of manufacturing a photodiode cell, including: forming a second-type epitaxial layer on a first-type substrate; forming heavily-doped second-type layers, each having a small depth, on the second-type epitaxial layer; and forming heavily-doped first-type layers, each having a narrow and shallow section, between the heavily-doped second-type layers.

In the forming of the heavily-doped first-type layers, each of the heavily-doped first-type layers may have a width of 1 μm or less.

Further, the method of manufacturing a photodiode cell may further include: floating the heavily-doped first-type layers after the forming of the heavily-doped first-type layers.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
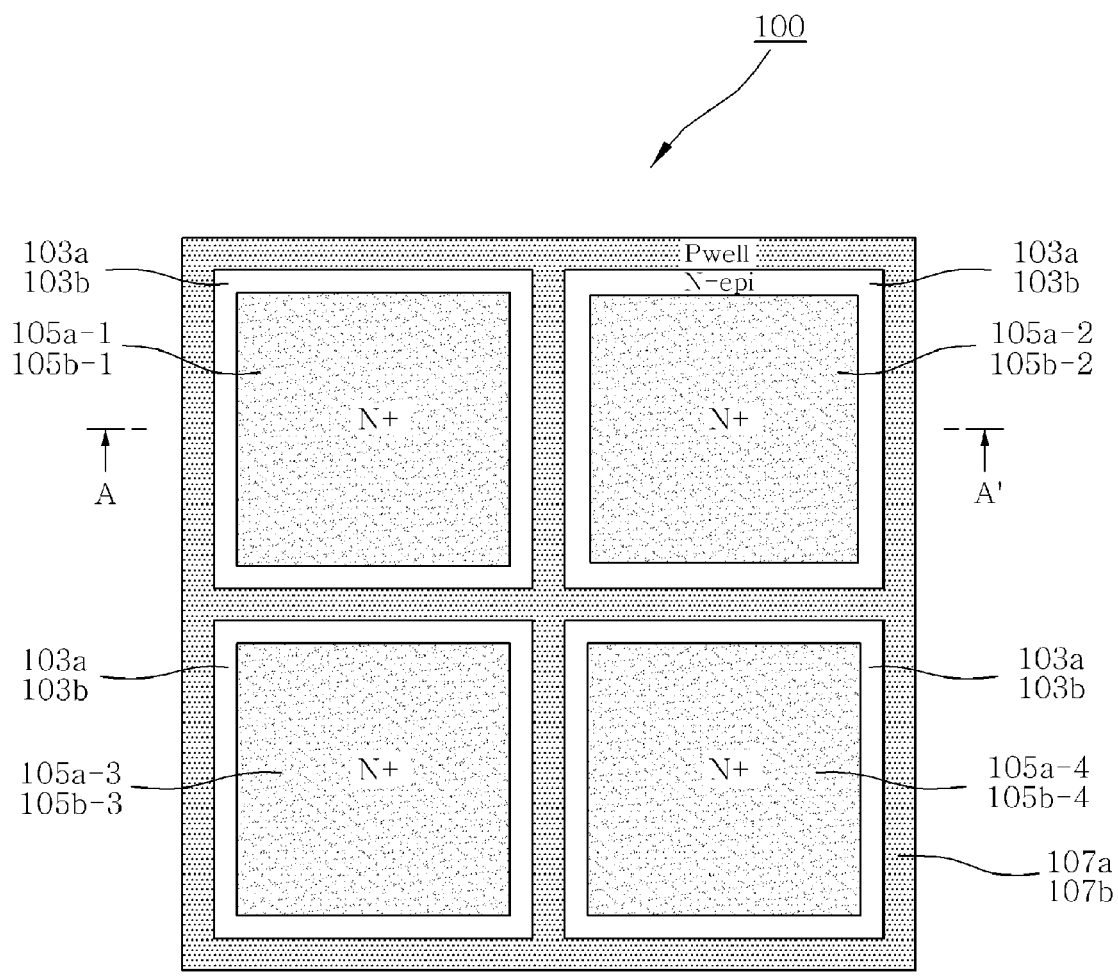
FIG. 1 is a plan view showing a conventional PIN-structured photodiode (PD) cell.
Figure 2A:
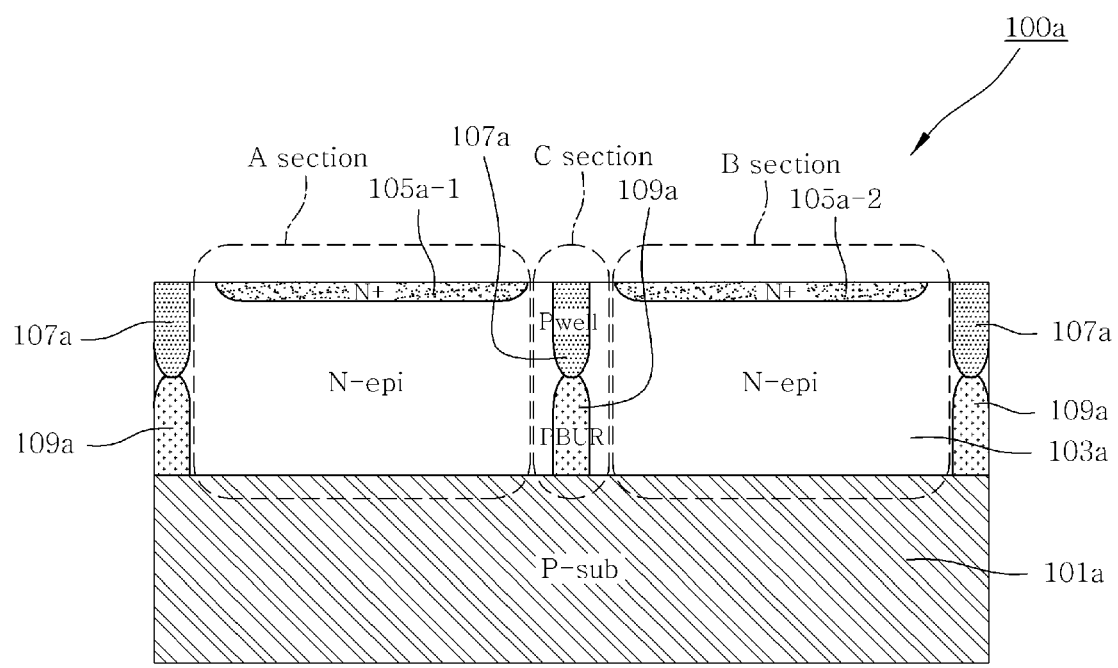
FIG. 2A is a sectional view of the photodiode (PD) cell taken along the line A-A' of FIG. 1.
Figure 2B:
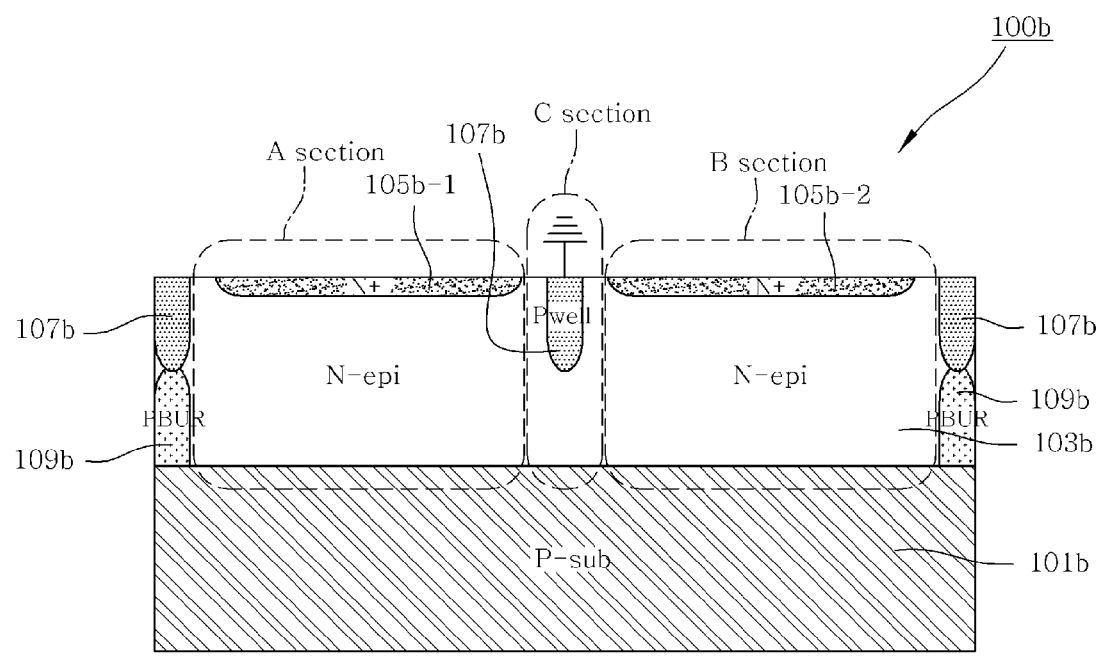
FIG. 2B is another sectional view of the photodiode (PD) cell taken along the line A-A' of FIG. 1.

Various objects, advantages and features of the invention will become apparent from the following description of embodiments with reference to the accompanying drawings.

Hereinafter, preferred embodiments of the present invention will be described in detail with reference to the attached drawings. Throughout the accompanying drawings, the same reference numerals are used to designate the same or similar components, and redundant descriptions thereof are omitted.

Generally, a photodiode cell used for optical pickup has a multi-divided structure, for example, an 8-divided or 12-divided structure. For the convenience of description, in the present invention, four-divided photodiode cells are used, and only two adjacent photodiode cells are shown in a sectional view taken vertically to a substrate.

Hereinafter, a photodiode cell structure of a photodiode integrated circuit for optical pickup and a method of manufacturing the same according to an embodiment of the present invention will be described.

Figure 3:
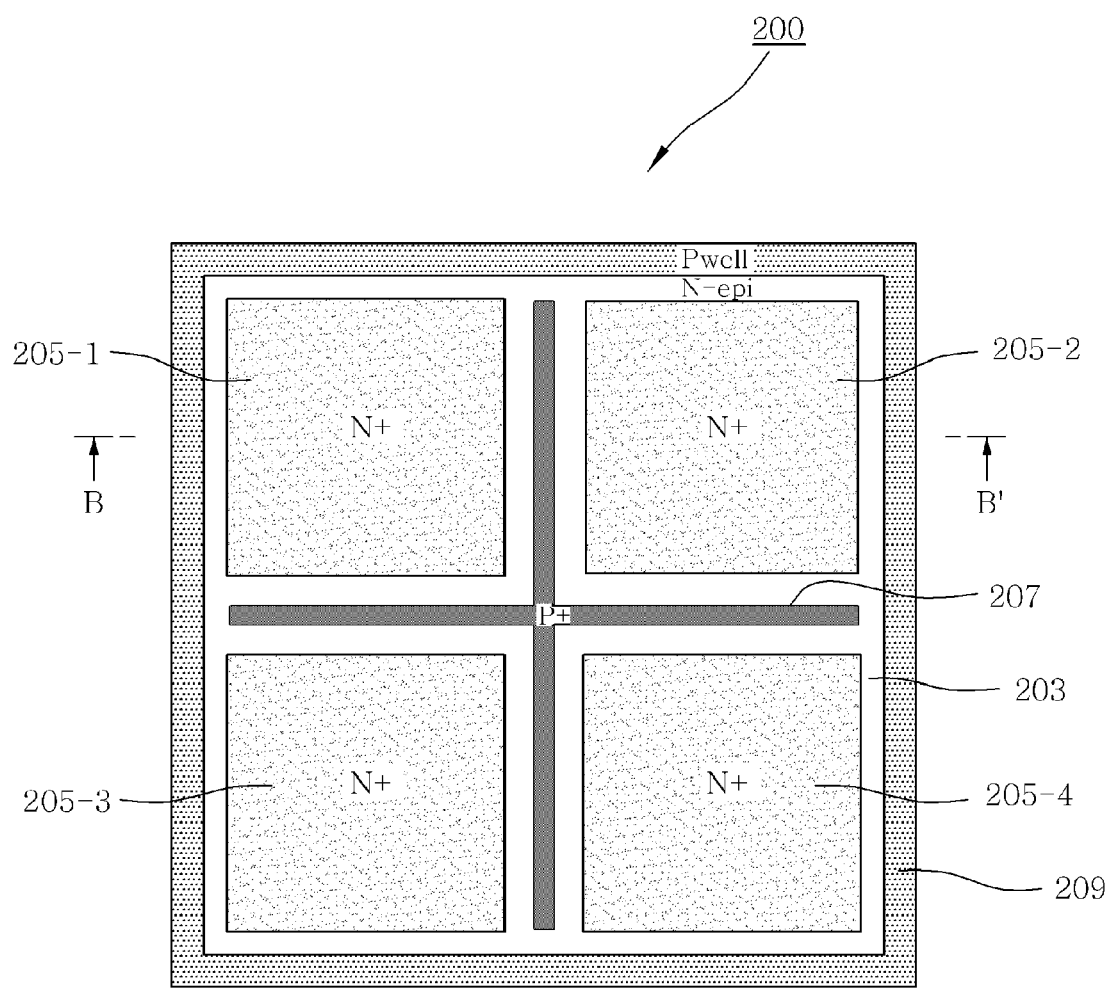
FIG. 3 is a plan view showing a four-divided photodiode cell structure of a photodiode integrated circuit for optical pickup according to an embodiment of the present invention.
Figure 4:
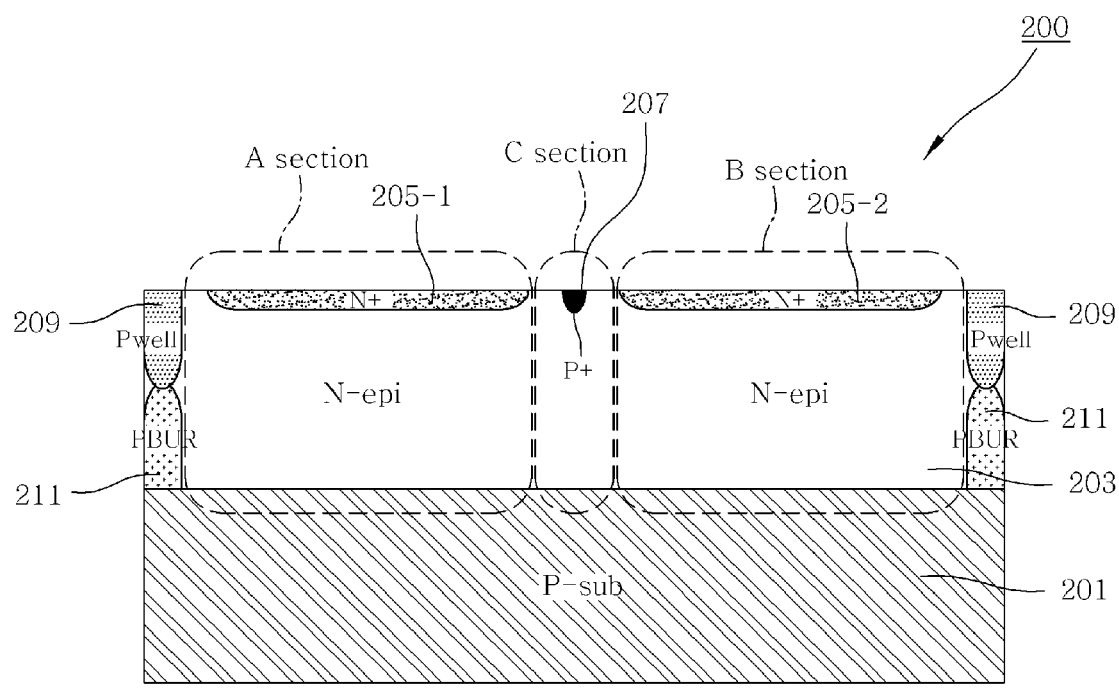
FIG. 4 is a sectional view of the four-divided photodiode cell structure taken along the line B-B' of FIG. 3.

FIG. 3 is a plan view showing a four-divided photodiode cell structure of a photodiode integrated circuit for optical pickup according to an embodiment of the present invention, and FIG. 4 is a sectional view of the four-divided photodiode cell structure taken along the line B-B' of FIG. 3.

Referring to FIGS. 3 and 4, a photodiode cell 200 according to an embodiment of the present invention includes a first-type substrate 201, a second-type epitaxial layer 203, heavily-doped second-type layers 205, and heavily-doped first-type layers 207. In this regard, the doped states of the first-type and second-type are opposite to each other (for example, if the first type is a P-type, the second-type is an N-type).

As shown in FIG. 4, the photodiode cell 200 according to an embodiment of the present invention further includes a first-type well 209 and a first-type BUR 211, which are disposed at the edge thereof.

The first-type substrate 201 may be a silicon-based substrate, for example, a P-type silicon substrate or an N-type silicon substrate. In this embodiment, a P-type silicon substrate, represented by 'P-sub' in the drawings, is used as the first-type substrate 201.

Further, the concentration of impurities doped on the first-type substrate 201 may be $10^{16}$ cm$^{-3}$ or more. When the concentration thereof is less than $10^{16}$ cm$^{-3}$, the resistance of the first-type substrate is increased, thus deteriorating the frequency characteristics of the photodiode cell 200.

The second-type epitaxial layer 203 is made of a silicon-based material, and may be formed by epitaxially growing the silicon-based material on the first-type substrate 201 using chemical vapor deposition (CVD).

This second-type epitaxial layer 203 is a light-absorbing layer, and the light absorbed therein can be converted into electrical signals. Specifically, heavily-doped second-type layers 205-1~4 are formed on the second-type epitaxial layer 203 through an ion implantation process to form a P-I-N, and thus the second-type epitaxial layer 203 can absorb light having wavelengths of 650 nm and 780 nm, and the light absorbed therein can be converted into electrical signals.

In this regard, the second-type epitaxial layer 203 is formed based on silicon carbide (SiC) or diamond having a similar lattice constant to silicon (Si), which is a group IV element, or silicon crystal. At the time of the epitaxial growth using the chemical vapor deposition (CVD), when a group III element (for example, boron) is added as a dopant, a P-type epitaxial layer can be obtained, and when a group V element (for example, phosphorus) is added as a dopant, an N-type epitaxial layer can be obtained.

In this case, the second-type epitaxial layer 203 may have a lower impurity concentration than that of the first-type substrate 201 and may have higher resistivity than that of the first-type substrate 201. Here, the impurity concentration of the second-type epitaxial layer 203 may be $10^{14}$ cm$^{-3}$ or less. When the impurity concentration thereof is more than $10^{14}$ cm$^{-3}$, the frequency characteristics of the photodiode cell 200 to the light having wavelengths of 650 nm and 780 nm can be deteriorated. In this embodiment, an N-type epitaxial layer, represented by 'N-epi' in the drawings, is used as the second-type epitaxial layer 203.

As shown in FIG. 3, the heavily-doped second-type layers 205-1~4 are formed such that four-divided light-receiving regions are disposed in the second-type epitaxial layer 203, and are thinly formed on the second-type epitaxial layer 203 using a highly-concentrated group III or V element through an ion implantation process. In this embodiment, heavily-doped N-type layers, represented by 'N$^+$' in the drawings, are used as the heavily-doped second-type layers 205-1~4.

The heavily-doped second-type layers 205-1~4 formed in this way become light-receiving regions. However, the adjacent heavily-doped second-type layers 205-1~4 must be completely isolated from each other in order to increase their optical efficiency.

When the adjacent heavily-doped second-type layers 205-1~4 are not completely isolated from each other, resistance is generated therebetween, thus badly influencing the output terminal of a photodetector for optical pickup. In other words, it means that the optical efficiency of the photodiode cell used in the photodetector for optical pickup is decreased.

Therefore, in the photodiode cell of a photodiode integrated circuit for optical pickup according to an embodiment of the present invention, as shown in FIG. 4, for example, a heavily-doped first-type layer 207 is narrowly and thinly formed between the two adjacent heavily-doped second-type layers 205-1 and 205-2 in order to isolate them from each other, thus increasing the resistance between the adjacent heavily-doped second-type layers 205-1~4. In this case, the width of the heavily-doped first-type layer 207 may be about 1 μm or less, and the depth thereof may be equal to or greater than that of the adjacent heavily-doped second-type layers 205-1~4. In this case, the width of the heavily-doped first-type layer 207 corresponds to about ¼ of that of the conventional first-type well (for example, P-well). In this embodiment, heavily-doped P-type layers, represented by 'P+' in drawings, are used as the heavily-doped first-type layers 207.

When the heavily-doped first-type layer 207 is formed in this way and then floated, since the heavily-doped first-type layer 207 and the second-type epitaxial layer 203 are joined in opposite types, a depletion layer is formed by the movement of pairs of electrons-holes occurring in a C region.

Accordingly, even when a voltage (for example, a reverse bias when the heavily-doped first-type layer 207 is a P-type layer, and a forward bias when the heavily-doped first-type layer 207 is an N-type layer) is not applied to the heavily-doped first-type layer 207 or the heavily-doped first-type layer 207 is not grounded, the depletion layer is formed even on the surface of the first-type substrate 201, and thus the adjacent two heavily-doped second-type layers 205-1 and 205-2 are completely isolated from each other.

The above-mentioned photodiode cell according to the present invention can be applied to 4×-speed PDICs for blue-ray.

As described above, according to the present invention, since highly-concentrated impurities having an opposite type to those of light-receiving regions are narrowly and thinly doped between the light-receiving regions in order to isolate the adjacent light-receiving regions from each other, the distances between the light-receiving regions is decreased, so that the size of the photodetector using this photodiode cell can be decreased, with the result that effective light-receiving regions are more enlarged, thereby improving the optical efficiency of the photodiode cell.

Further, according to the present invention, dark current can be decreased by floating the layers narrowly and thinly doped with highly-concentrated impurities having an opposite type to those of light-receiving regions in order to isolate the adjacent light-receiving regions from each other instead of applying an voltage to the layers or grounding the layers, and thus the noise characteristics of the photodiode cell can also be improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A photodiode cell, comprising:
   a first-type substrate;
   a second-type epitaxial layer disposed on the first-type substrate;
   heavily-doped second-type layers, each having a small depth, formed on the second-type epitaxial layer; and
   heavily-doped first-type layers, each having a shallow depth and width of less than 1 μm, disposed on the second-type epitaxial layer and formed between the heavily-doped second-type layers,
   wherein the first-type and second-type have opposite doped states.

2. The photodiode cell according to claim 1, wherein the first type is a P-type, and the second-type is an N-type.

3. The photodiode cell according to claim 1, wherein the first-type substrate has an impurity concentration of $10^{16}$ cm$^{-3}$ or more.

4. The photodiode cell according to claim 1, wherein the second-type epitaxial layer has an impurity concentration of $10^{14}$ cm$^{-3}$ or less.

5. The photodiode cell according to claim 1, wherein depths of the heavily-doped first-type layers are equal to or greater than those of the heavily-doped second-type layers.

6. The photodiode cell according to claim 1, wherein the heavily-doped first-type layers are floated.

7. A method of manufacturing a photodiode cell, comprising:
   forming a second-type epitaxial layer on a first-type substrate;
   forming heavily-doped second-type layers, each having a small depth, on the second-type epitaxial layer; and
   forming heavily-doped first-type layers, each having a shallow depth and width of less than 1 μm, between the heavily-doped second-type layers.

8. The method of manufacturing a photodiode cell according to claim 7, further comprising: floating the heavily-doped first-type layers after the forming of the heavily-doped first-type layers.

* * * * *